US006893948B2

United States Patent
Ballantine et al.

(10) Patent No.: US 6,893,948 B2
(45) Date of Patent: May 17, 2005

(54) METHOD OF REDUCING POLYSILICON DEPLETION IN A POLYSILICON GATE ELECTRODE BY DEPOSITING POLYSILICON OF VARYING GRAIN SIZE

(75) Inventors: Arne W. Ballantine, Round Lake, NY (US); Kevin K. Chan, Staten Island, NY (US); Jeffrey D. Gilbert, Burlington, VT (US); Kevin M. Houlihan, Boston, MA (US); Glen L. Miles, Essex Junction, VT (US); James J. Quinlivan, Essex Junction, VT (US); Samuel C. Ramac, Essex Junction, VT (US); Michael B. Rice, Colchester, VT (US); Beth A. Ward, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/616,962

(22) Filed: Jul. 11, 2003

(65) Prior Publication Data

US 2004/0023476 A1 Feb. 5, 2004

Related U.S. Application Data

(62) Division of application No. 09/802,702, filed on Mar. 10, 2001, now Pat. No. 6,670,263.

(51) Int. Cl.[7] ............... H01L 21/20; H01L 21/3205; H01L 21/4763
(52) U.S. Cl. ................ 438/585; 438/592; 438/488
(58) Field of Search .................. 438/592, 655, 438/585, 593, 595, 587, 199, 287

(56) References Cited

U.S. PATENT DOCUMENTS

| | | | |
|---|---|---|---|
| 5,164,338 A | | 11/1992 | Graeger et al. |
| 5,242,847 A | * | 9/1993 | Ozturk et al. ............... 438/300 |
| 5,346,850 A | | 9/1994 | Kaschmitter et al. |
| 5,441,904 A | * | 8/1995 | Kim et al. .................. 438/592 |
| 5,456,763 A | | 10/1995 | Kaschmitter et al. |
| 5,776,989 A | | 7/1998 | Kubota et al. |
| 6,008,077 A | | 12/1999 | Maeda |
| 6,017,810 A | | 1/2000 | Furukawa et al. |
| 6,150,251 A | * | 11/2000 | Yew et al. .................. 438/592 |
| 6,221,744 B1 | * | 4/2001 | Shih et al. ................. 438/585 |

* cited by examiner

Primary Examiner—John F. Niebling
Assistant Examiner—Ron Pompey
(74) Attorney, Agent, or Firm—Connolly Bove Lodge & Hutz LLP; Larry J. Hume; William D. Sabo

(57) ABSTRACT

Polysilicon electrical depletion in a polysilicon gate electrode is reduced by depositing the polysilicon under controlled conditions so as to vary the crystal grain size through the thickness of the polysilicon. The resulting structure may have two or more depth-wise contiguous regions of respective crystalline grain size, and the selection of grain size is directed to maximize dopant activation in the polysilicon near the gate dielectric, and to tailor the resistance of the polysilicon above that first region and more distant from the gate dielectric. This method, and the resulting structure, are advantageously employed in forming FETs, and doped polysilicon resistors.

17 Claims, 2 Drawing Sheets

METHOD OF REDUCING POLYSILICON DEPLETION IN A POLYSILICON GATE ELECTRODE BY DEPOSITING POLYSILICON OF VARYING GRAIN SIZE

CROSS REFERENCE TO RELATED APPLICATIONS

This application is a Division of application Ser. No. 09/802,702, filed on Mar. 10, 2001, now U.S. Pat. No. 6,670,263 by Arne W. Ballantine, et al, entitled METHOD OF REDUCING POLYSILICON DEPLETION IN A POLYSILICON GATE ELECTRODE BY DEPOSITING POLYSILICON OF VARYING GRAIN SIZE, the entire contents of which is incorporated by reference, and for which priority is claimed under 35 U.S.C. § 120.

FIELD OF THE INVENTION

The present invention relates to a method of reducing polysilicon depletion and modulating resistance in a polysilicon gate electrode, by depositing the polysilicon controllably so as to vary in a predetermined manner the grain size of the polysilicon through its thickness. In particular, according to this invention, a method is provided for producing a polysilicon structure in which the crystalline composition of the polysilicon is varied in a controlled manner during deposition, which results in the structure having a controllably varied crystalline composition as a function of depth.

BACKGROUND OF THE INVENTION

Field effect transistors (FETs) and doped polysilicon resistors are common elements in solid state circuits. Gate conductors are formed by the deposition of crystalline polysilicon which is subsequently doped and, in many instances, must have a predetermined electrical resistance. Furthermore, it is important that polysilicon electrical depletion adjacent to an interface with dielectric be minimized in order to improve transistor performance.

U.S. Pat. No. 6,017,810, to Furukawa et al., titled "Process for Fabricating Field Effect Transistor with a Self-Aligned Gate to Device Isolation", suggests a method for forming a gate conductor from an $N^+$ or $P^+$ type doped polycrystalline silicon on an insulating layer, but does not teach variation of crystal grain size in controlled manner.

U.S. Pat. No. 5,766,989, to Maegawa et al., titled "Method for Forming Polycrystalline Thin Film and Method for Fabricating Thin Film Transistor", suggests a method of forming a polysilicon semiconductor thin film, which, in part, contains microcrystals that serve as crystal nuclei for polycrystallization on an insulating substrate. The film is polycrystallized by laser annealing to generate crystals all of substantially the same size. This reference discusses prior art in which excimer laser radiation is employed to generate polycrystalline layers having crystals of different size where the variation occurs laterally, i.e., in a direction perpendicular to a direction of the thickness of the polysilicon.

U.S. Pat. No. 5,346,850, to Kaschmitter et al., titled "Crystallization and Doping of Silicon on Low Temperature Plastic", suggests the use of short-pulsed high energy processing of an amorphous silicon layer to crystallize the same.

U.S. Pat. No. 5,164,338, to Graeger et al., titled "Method of Manufacturing a Polycrystalline Semiconductor Resistance Layer of Silicon on a Silicon body and Silicon Pressure Sensor Having Such a Resistance Layer," suggests a method of manufacturing a polycrystalline semiconductor resistance layer over an insulating layer, in which the polysilicon is first applied as a continuous nearly amorphous silicon layer. This layer is thermally processed to promote the epitaxial growth of additional polycrystalline silicon thereon.

It is considered that none of the known prior art teaches a method in which a crystalline polysilicon deposit has a controlled crystal size varying with depth.

SUMMARY OF THE INVENTION

This invention provides a method of forming a crystalline polysilicon deposit in which crystal grain size is controllably varied with depth of the deposit in a simple and versatile fashion.

This invention also makes possible a structure in which a deposit of crystalline polysilicon is formed to have a predetermined variation in crystal grain size as a function of depth.

Accordingly, in a first aspect of this invention there is provided a method of forming a polycrystalline silicon structure in which crystal grain size varies as a function of depth, control being exercised to vary at least one of temperature, pressure and flow rate of a silane gas while depositing silicon therefrom, to thereby control the crystal grain size as a function of depth in the deposited silicon structure.

In another aspect of this invention, there is provided a method of forming a polysilicon gate electrode structure on a gate dielectric, which includes the steps of depositing on the gate dielectric silicon crystals of substantially a first size and, thereafter, contiguously with the crystals of the first depositing additional silicon crystals of substantially a second size.

In a related aspect of this invention, there is provided a CMOS transistor structure which includes a gate conductor formed on a gate dielectric. The gate conductor comprises a multi-region polycrystalline silicon in which a first region adjacent the dielectric has crystals of a first grain size, and a second region formed contiguously over the first region has crystals of a second grain size.

In yet another related aspect of this invention, there is provided a dopes poly-Si resistor structure which includes a multi-region polycrystalline silicon structure formed over a dielectric.

These and other aspects and advantages of the present invention will be understood from the following detailed description with reference to the appended figures.

DETAILED DESCRIPTION OF THE PREFERRED EMBODIMENT

In order to facilitate a clear understanding of the present invention, reference will be made to FIGS. 1–4, which are cross-sectional views to illustrate a diagrammatic representation of the steps of forming structures according to different embodiments of the present invention.

Figure 1:
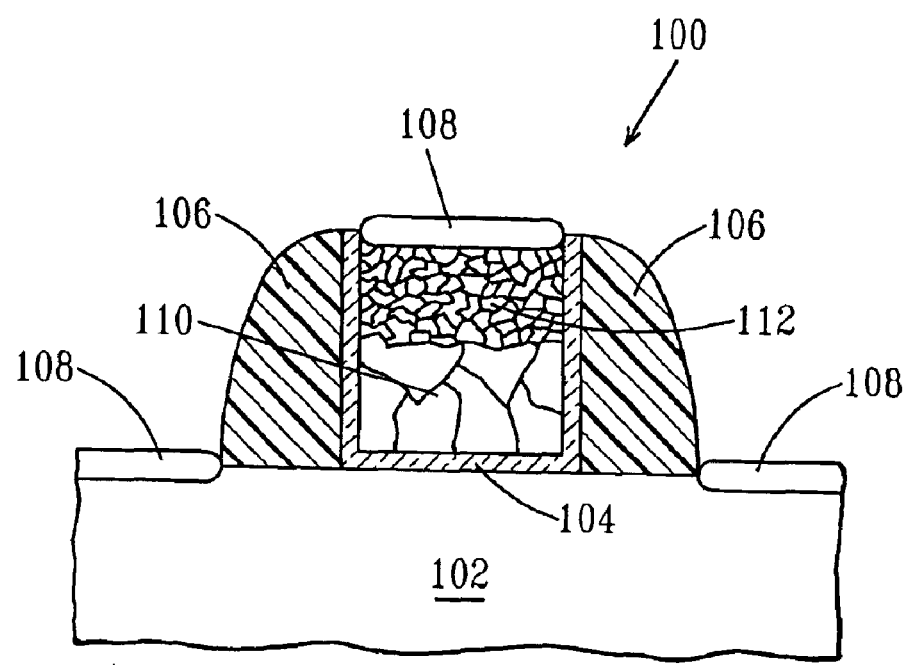
FIG. 1 is a cross-sectional view of a gate conductor structure formed according to this invention, in which the polysilicon gate conductor element comprises a lower region having a relatively large crystal grain size and an upper region having a relatively smaller grain size.
Figure 2:
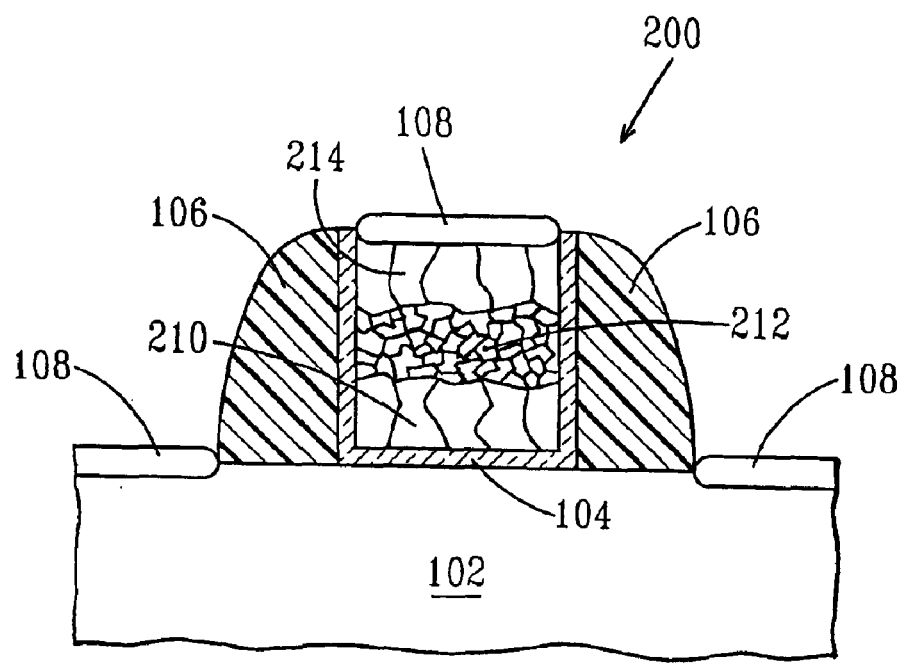
FIG. 2 is a cross-sectional view of a structure of a gate conductor element having three distinct regions, with the lowest region and the highest region containing crystals of relatively large grain size and an intermediate layer containing crystals of relatively smaller grain size.

FIG. 1 illustrates a structure 100 in which a silicon substrate 102 supports a CMOS transistor. In this structure, there is provided a gate dielectric layer 104 bounded by spacers 106, 106 made of an insulating material. On substrate 102, bounding and on top of the gate conduction structure is provide a silicide layer 108. Using the surface of gate dielectric 104 as a base, by controlling a deposition parameter, e.g., temperature, a polysilicon layer is formed by decomposition of a gas such as silane, disilane, or dichlorosilane or the like, in known manner, to produce a first region 110 that has crystals of a relatively large first grain size. Formed contiguously thereon, by further control exercised over one or more deposition parameters, is a second region 112 containing crystals of a relatively smaller grain size. The result is that the gate conductor is formed of the same crystalline polysilicon material but comprises multiple regions characterized by different grain sizes, with the regions formed contiguously and in the same manufacturing process.

Formation of the structure as described has two advantages, compared to the prior art, in forming doped dual-work function polysilicon gate structures. The multi-region crystalline polysilicon gate structure is found to: (a) maximize dopant activation near the gate dielectric 104; and (b) independently control the resistance of the polysilicon above that first region, i.e., in the upper small crystal size region 112 located further away from the gate dielectric 104. In the structure according to this invention, dopant is most effectively activated in the larger crystal region 110 so that polysilicon depletion is minimized.

By altering the deposition sequence, the smaller crystal region could be placed adjacent to the gate dielectric and the large crystal region further from the gate dielectric.

In another aspect of this invention, the crystalline structure of the multi-region polysilicon is controlled to allow for improved functioning thereof as a gate conductor with low polysilicon depletion, and is also further controlled to provide a selected resistance which meets designed targets. As best understood with reference with FIG. 2, in order to create such a structure the bottom region of the crystalline polysilicon is deposited as required for activation to minimize polysilicon depletion, exactly as discussed above with reference to FIG. 1. Then, for example per the structure 200 illustrated in FIG. 2, the uppermost region 214 of the polysilicon is deposited contiguous with the immediately underlying region 212 by using a different parameter value, e.g., an increased pressure, so that the electrical resistance of the polysilicon in this third region will be significantly different. Note that some of the same elements are provided with the same identifying numerals in these different structures, e.g., substrate 102, silicide 108, 108, etc., for ease of reference. In summary, in the structure per FIG. 2, the multi-region polycrystalline silicon comprises a first region 210 having an interface with dielectric layer 104. This is followed by a second region 212 characterized by having relatively smaller crystal grain size, followed by a third region 214 contiguous with region 212 and characterized by having a larger crystal grain size. The function of this third region 214 is to modify the electrical resistance of the gate conductor. It is produced by suitable control exercised over a selected parameter, e.g., pressure of a silane gas flow providing the silicon, during formation of the multi-region.

Another parameter, or more than one parameter relating to the silane gas flow, e.g., pressure, temperature, or flow rate, may be altered as deemed appropriate.

It is evident that by altering the deposition sequence, the larger and smaller grained regions may be deposited in any order desired. The upper portion of the gate conductor polysilicon may be consumed by silicide.

The silicide layers 108, 108 may comprise, for example, cobalt or titanium silicide.

Figure 3:
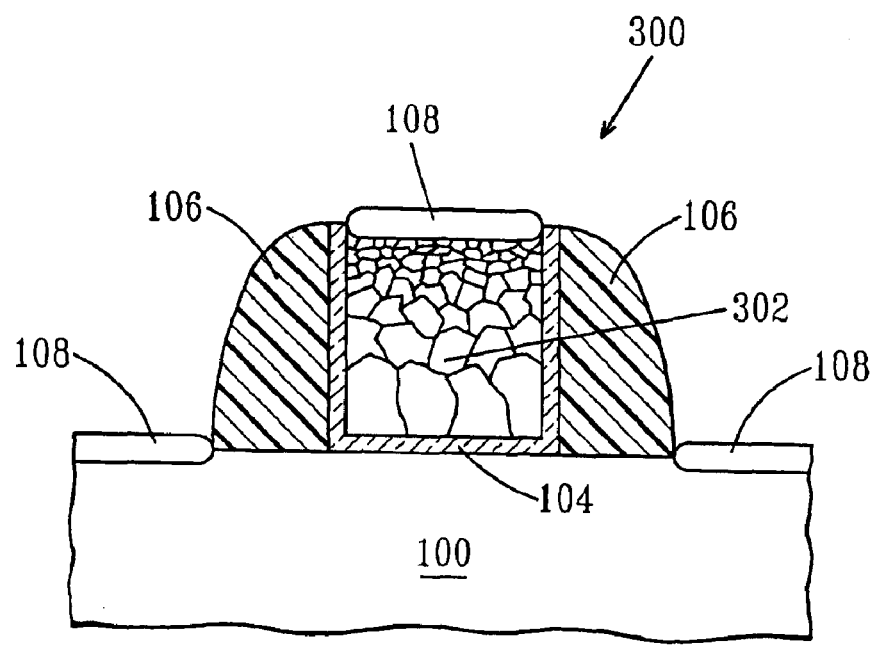
FIG. 3 is a cross-sectional view of a similar structure, except that it shows the crystal grain size decreasing monotonically with distance from a base of the crystalline polysilicon deposit.

FIG. 3 shows yet another variation 300, namely one in which the polysilicon is deposited under conditions in which a selected parameter, e.g., pressure, is varied in controlled manner so that as the depth of the deposit 302 increases the crystal grain size continuously changes. Thus, in FIG. 3 the polysilicon crystal grain size immediately adjacent to dielectric 104 is the largest and crystal grain size diminishes continuously with distance away from the interface of the polysilicon with dielectric layer 104.

It is again evident that by altering the deposition sequence the grain size could be made to increase with distance from the gate dielectric.

Figure 4:
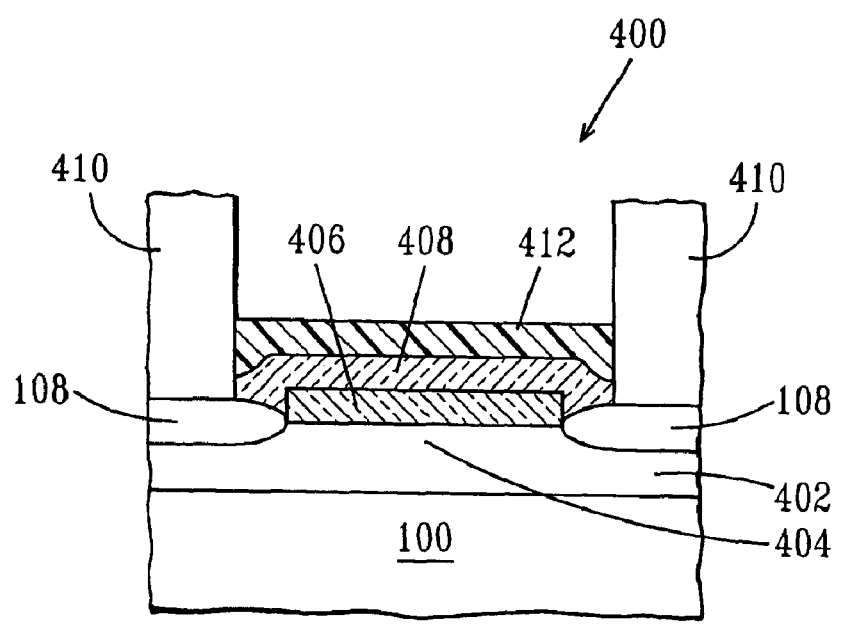
FIG. 4 is a cross-sectional view of a doped polysilicon resistor structure, in which multi-grain crystalline polysilicon as taught in this invention is employed and in which a resistance-tailored region is left unconsumed.

FIG. 4 in cross-sectional form illustrates the use of a multi-region polysilicon element, as taught herein, to form a doped polysilicon resistor structure 400. In this structure, above insulating substrate 100 is provided a multi-region polysilicon structure as taught herein. A nitride layer 406 is provided to block consumption of the upper portion of the polysilicon 404 during silicide formation, so that the upper portion of the polysilicon resistor is not consumed, and so contributes to the resistivity of the entire structure. This allows for tailoring of the resistance value for the resistor. The resistor is completed by depositing a barrier nitride layer 408 and BPSG layer 412. Conventional tungsten contacts 410, 410 may be employed as indicated.

It will be appreciated from the above by persons of ordinary skill in the art that a multi-region polysilicon element, formed as described herein by simple control exercised over a key parameter, or even more than one deposition parameter, during the silicon deposition process, can provide a high versatility in use of the process in various applications.

Also claimed in this invention is the control of a flow of dopant gas to allow for creation of a layer of the multi-region polysilicon gate element which may, thereby, be doped or counter-doped in-situ. Thus, for example, if a p-type in situ doping is performed during the last portion of the multi-region polycrystalline deposition, a polysilicon resistor of p-type will have relatively low resistance.

In one aspect, the method of forming a crystalline polysilicon gate electrode structure on a gate dielectric may include controlling a variation of at least one of temperature, pressure, and flow rate of a continuous flow of silane or related silicon precursor species while depositing polysilicon in the silane or silicon precursor as crystals of correspondingly controlled grain size. Further, the variation may be controlled in step wise manner, to thereby form a multi-region polycrystalline silicon deposit comprising regions having crystals of respective grain size.

In both N and P type FET devices, formation of the silicide 108 will consume the upper polysilicon region which is either doped or counter-doped by in-situ doping.

Furthermore, to facilitate a higher level of dopant activation, or to provide a break in the dopant distribution, in order to allow for either improved gate performance or OP resistor tuning, a layer rich in carbon atoms or a region of silicon germanium may be deposited at an intermediary selected stage during the deposition of the multi-region polysilicon. This, also, is contemplated as being within the scope of the present invention.

In summary, a readily adapted multi-region polysilicon structure can be formed, and modified to facilitate the manipulation of dopant materials and the like, by careful control exercised over one or more parameters affecting the regional growth of crystal grain size and/or composition during deposition of the polysilicon material.

When the present invention is employed to form a doped polysilicon resistor, for example, per FIG. 4, the lower region of the polycrystalline silicon is deposited under conditions selected to minimize polysilicon depletion for the FET devices: for example, 710° C., 40 Torr, pressure 500 sccm silane flow. The upper region of the polysilicon gate is generally formed to include a region having a predetermined electrical resistance to tailor the overall resistance of the polysilicon resistor.

Provided below is a table summarizing data indicative of the polysilicon deposition conditions necessary to obtain a specific electrical resistance value in ohm/square for polysilicon resistors; deposited thickness=200 nm, doped with 3.5E15 Boron for P-type and 2.5 E15 Arsenic for N-type polysilicon resistors.

| Pressure/SiH4 flow | 350 sccm | 500 sccm | 850 sccm |
|---|---|---|---|
| P-TYPE POLYSILICON RESISTOR | | | |
| 20 Torr | | 214 | |
| 40 Torr | | 204 | |
| 80 Torr | 200 | 174 | 156 |
| N-TYPE POLYSILICON RESISTOR | | | |
| 20 Torr | | 431 | |
| 40 Torr | | 417 | |
| 80 Torr | 399 | 376 | 348 |

Persons of ordinary skill in the art, upon understanding the invention as disclosed herein, may be expected to consider obvious variations and modifications of both the method and the structures taught herein. All such variations are considered to be comprehended within this invention which is limited solely by the claims appended below:

What is claimed is:

1. A method of forming a crystalline polysilicon gate electrode structure on a gate dielectric, the method comprising:
   depositing, on the gate dielectric, polysilicon crystals of substantially a first size;
   cooperatively selecting a second grain size in conjunction with the first size so as to maximize a dopant activation in a region near the gate dielectric; and
   contiguously with the crystals of the first size, depositing directly thereon additional polysilicon crystals of substantially the second size; wherein second grain size is controlled, at least in part, by a variation of pressure of a continuous flow of a silicon precursor species.

2. The method according to claim 1, wherein:
   the first crystal size is larger than the second crystal size.

3. The method according to claim 1, wherein:
   the first crystal size is smaller than the second crystal size.

4. A method of forming a crystalline polysilicon gate electrode structure on a gate dielectric, the method comprising:
   controlling a variation of at least pressure of a continuous flow of or related silicon precursor species while depositing polysilicon therefrom as crystals of correspondingly controlled grain size; and
   forming a multi-region polycrystalline silicon deposition having regions with crystals of respectively different grain sizes by controlling said variation.

5. The method according to claim 4, wherein:
   the variation is controlled in a step wise manner and a multi-region polycrystalline silicon deposit is formed comprising regions having crystals of respective grain sizes.

6. The method according to claim 5, wherein, during said depositing polysilicon,
   crystals deposited in a first region adjacent to the gate dielectric have a first grain size selected to maximize dopant activation near the gate dielectric and a second region has crystals of a second grain size deposited more distantly from the gate dielectric.

7. A method of forming a polycrystalline silicon structure in which crystal grain size varies as a function of depth, the method comprising:
   controlling a variation of at least pressure of a continuous flow of silicon precursor species gas while depositing silicon therefrom on a substrate; and
   controlling the crystal grain size as a function of depth in the polysilicon structure; and
   forming a plurality of regions having respective different grain sizes.

8. The method according to claim 7, wherein:
   the polycrystalline silicon structure is a gate electrode formed on a gate dielectric, and comprises a first region having a first crystal grain size and a second region formed thereon and having a second grain size,
   wherein the first and second grain sizes are selected to maximize dopant activation in the first region and to achieve a specific resistance in the second region.

9. The method according to claim 8, further comprising:
   depositing a third region formed on the second region having crystals of a third grain size so as to further tailor the specific resistance of the gate electrode.

10. The method according to claim 7, further comprising controlling a pressure of the silane gas so as to vary an electrical resistance of the deposited silicon inversely with the controlled pressure.

11. The method according to claim 7, further comprising:
    providing a controlled flow of a dopant gas during a selected portion of the step of depositing polysilicon, to thereby enable selected doping or counter-doping of a portion of the deposited polysilicon.

12. The method according to claim 11, wherein:
    the dopant gas is selected to provide one of a p-type or an n-type doping during a final portion of the step of depositing polysilicon.

13. The method according to claim 7, further comprising:
    forming a layer rich in carbon atoms at a selected stage of the silicon deposition.

14. The method according to claim 7, further comprising:
    forming a layer of silicon-germanium at a selected stage of the silicon deposition.

15. The method according to claim 7, wherein:
    the variation is controlled to deposit the polysilicon so that the crystal grain size varies monotonically during the deposition of the polysilicon.

16. The method of claim 4, wherein said forming a multi-region polycrystalline silicon deposition comprises forming at least first, second, and third regions having respective crystal grain sizes.

17. The method of claim 16, wherein the first and second regions are separated by the second region, and wherein the first and third regions have respective grain sizes which are essentially equal.

* * * * *